«12» United States Patent
Kuo et al.

(10) Patent No.: US 8,704,345 B2
(45) Date of Patent: Apr. 22, 2014

(54) SEMICONDUCTOR PACKAGE AND LEAD FRAME THEREOF

(75) Inventors: Chih-Ming Kuo, Hsinchu County (TW); Shih-Chieh Chang, Chiayi County (TW); Chih-Hsien Ni, Hsinchu (TW); Chin-Tang Hsieh, Kaohsiung (TW); Chia-Jung Tu, Hsinchu County (TW); Lung-Hua Ho, Hsinchu (TW)

(73) Assignee: Chipbond Technology Corporation, Hsinchu (TW)

( * ) Notice: Subject to any disclaimer, the term of this patent is extended or adjusted under 35 U.S.C. 154(b) by 0 days.

(21) Appl. No.: 13/613,309

(22) Filed: Sep. 13, 2012

(65) Prior Publication Data

US 2013/0334671 A1 Dec. 19, 2013

(30) Foreign Application Priority Data

Jun. 19, 2012 (TW) .............................. 101121828 A

(51) Int. Cl.
*H01L 23/495* (2006.01)
*H01L 23/48* (2006.01)

(52) U.S. Cl.
USPC ..... 257/673; 257/666; 257/778; 257/E23.031

(58) Field of Classification Search
USPC ........................... 257/673, 666, 778, E23.031
See application file for complete search history.

(56) References Cited

U.S. PATENT DOCUMENTS

| 7,563,647 | B2* | 7/2009 | Bathan et al. ................. 438/122 |
| 7,619,303 | B2* | 11/2009 | Bayan ............................ 257/666 |
| 7,901,996 | B2* | 3/2011 | Bathan et al. ................. 438/123 |
| 8,298,871 | B2* | 10/2012 | Wong et al. ................... 438/123 |
| 2003/0193080 | A1* | 10/2003 | Cabahug et al. ............. 257/666 |
| 2007/0040250 | A1* | 2/2007 | Kajiwara et al. ............. 257/673 |
| 2007/0108565 | A1* | 5/2007 | Shim et al. ................... 257/676 |
| 2009/0160039 | A1* | 6/2009 | Wong et al. .................. 257/673 |

\* cited by examiner

*Primary Examiner* — Nitin Parekh
(74) *Attorney, Agent, or Firm* — Jackson IPG PLLC

(57) ABSTRACT

A semiconductor package includes a lead frame, at least one chip and a molding compound. The lead frame comprises a plurality of leads, each lead comprises a first end portion and at least one coupling protrusion, wherein the first end portion comprises a first upper surface, the coupling protrusion comprises a ring surface and is integrally formed as one piece with the first upper surface. The chip disposed on top of the leads comprises a plurality of bumps and a plurality of solders, the coupling protrusions embed into the solders to make the ring surfaces of the coupling protrusions cladded with the solders. The solders cover the first upper surfaces. The chip and the leads are cladded with the molding compound.

7 Claims, 2 Drawing Sheets

SEMICONDUCTOR PACKAGE AND LEAD FRAME THEREOF

FIELD OF THE INVENTION

The present invention is generally related to a semiconductor package, which particularly relates to the semiconductor package without any flux.

BACKGROUND OF THE INVENTION

A conventional semiconductor package utilizes solders for connection between a lead frame and a chip, and a flux must be added during the step of reflowing. However, in the step of reflowing, coupling strength and electrical reliability between the lead frame and the chip declines once the solders become over-collapsed. Besides, the flux must be removed after the step of reflowing therefore increasing process complexity.

SUMMARY

The primary object of the present invention is to provide a semiconductor package including a lead frame, at least one chip and a molding compound. The lead frame comprises a plurality of leads, each lead comprises a first end portion, a half-etched portion in connection with the first end portion and at least one coupling protrusion, wherein the first end portion comprises a first upper surface and a first lower surface, the half-etched portion comprises a second upper surface and a second lower surface, the coupling protrusion is integrally formed as one piece with the first upper surface and comprises a ring surface. The chip disposed on top of the leads comprises a plurality of bumps and a plurality of solders formed at the bumps. The coupling protrusions embed into the solders to make the ring surfaces of the coupling protrusions cladded with the solders, and the solders cover the first upper surfaces. The molding compound exposes the first lower surface of each of the first end portions. The chip and the leads are cladded with the molding compound. In heat lamination process of the present invention, by means of the coupling protrusions integrally formed as one piece with the leads, the coupling protrusions directly penetrate through the solders and connect the bumps of the chip to make the lead frame electrically connected with the chip, which raises electrical reliability and coupling strength between the lead frame and the chip. Meantime, the feature mentioned above enables to omit the usage and clearance of a flux therefore lowering process complexity. Furthermore, joining height of the solders can be maintained via fixed height coupling protrusions.

DETAILED DESCRIPTION OF THE INVENTION

Figure 1:
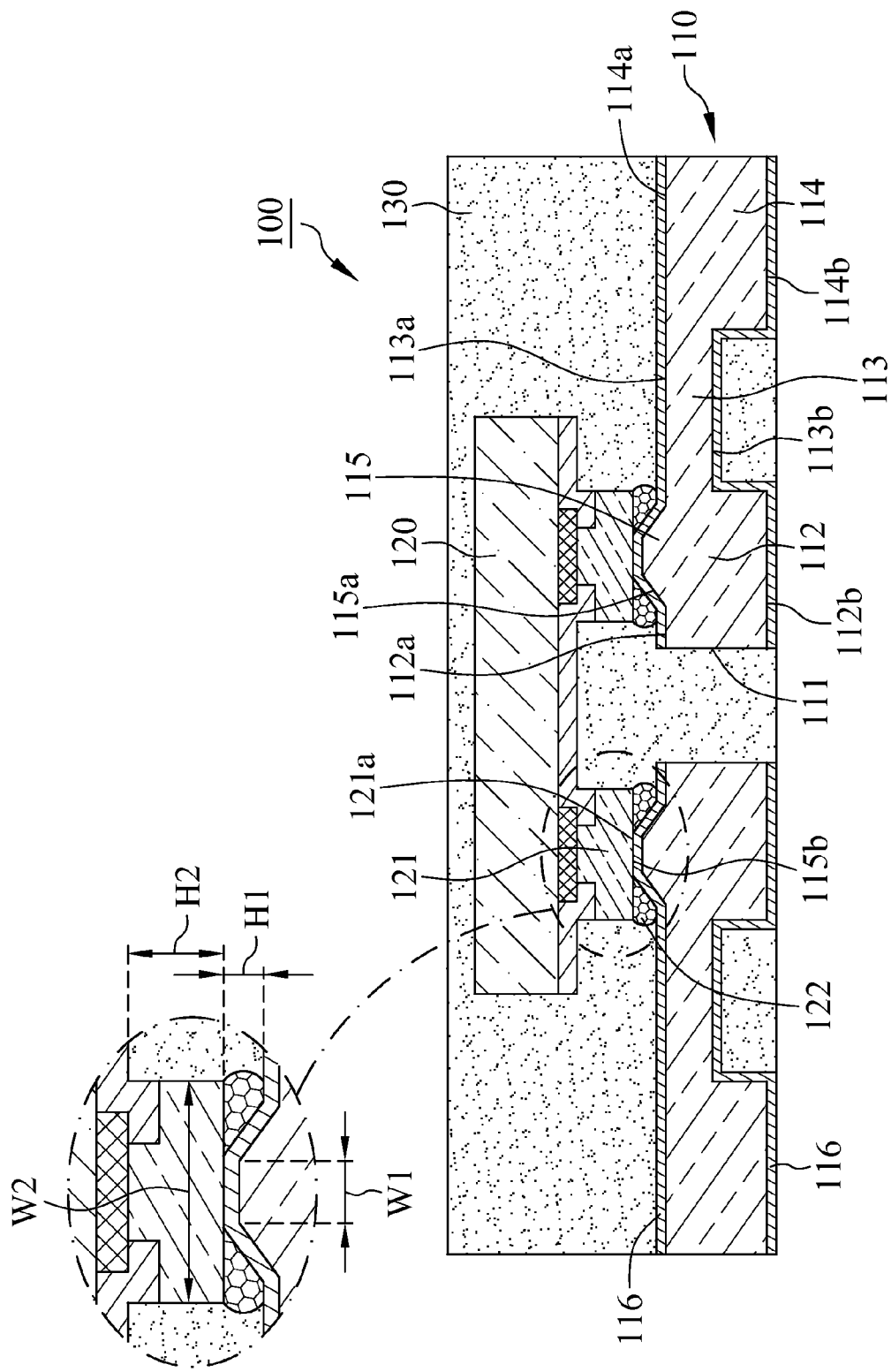
FIG. 1 is a cross-section view illustrating a semiconductor package in accordance with a preferred embodiment of the present invention.
Figure 2:
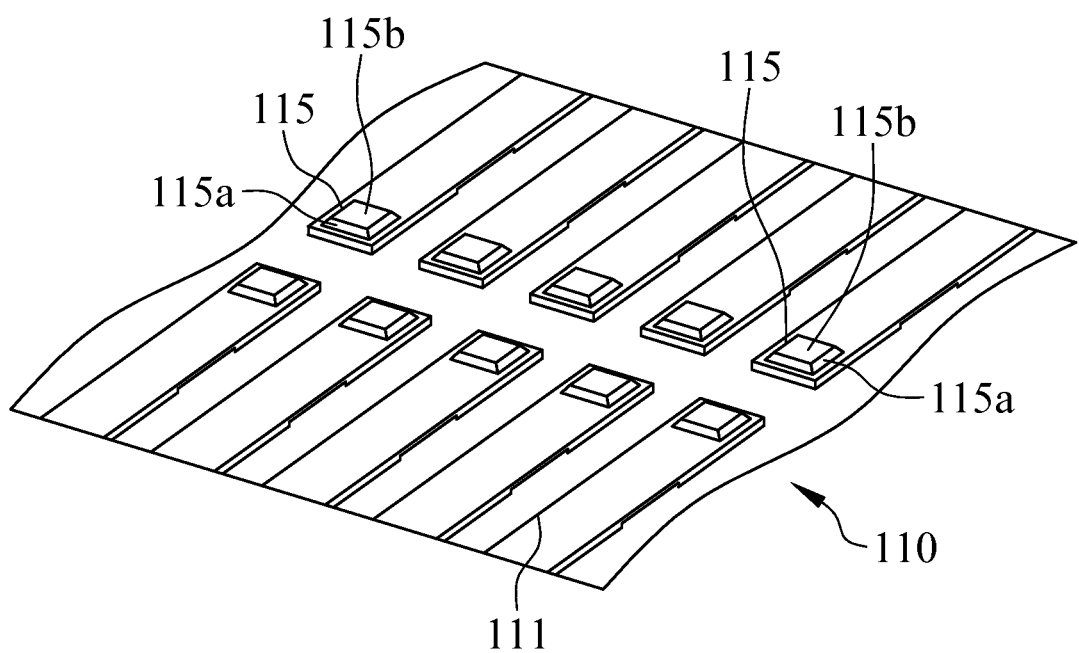
FIG. 2 is a partial schematic view illustrating the semiconductor package in accordance with a preferred embodiment of the present invention.

With reference to FIGS. 1 and 2, a semiconductor package 100 in accordance with a preferred embodiment of the present invention includes a lead frame 110, at least one chip 120 and a molding compound 130.

Referring to FIG. 2 again, the lead frame 110 comprises a plurality of leads 111, each lead 111 comprises a first end portion 112, a half-etched portion 113 in connection with the first end portion 112, a second end portion 114 in connection with the half-etched portion 113 and at least one coupling protrusion 115, wherein the half-etched portion 113 is located between the first end portion 112 and the second end portion 114, the first end portion 112 comprises a first upper surface 112a and a first lower surface 112b, the half-etched portion 113 comprises a second upper surface 113a and a second lower surface 113b, and the second end portion 114 comprises a third upper surface 114a and a third lower surface 114b. The coupling protrusion 115 is integrally formed as one piece with the first upper surface 112a and comprises a ring surface 115a. In this embodiment, each ring surface 115a is an inclined surface. Referring to FIG. 1 again, the chip 120 disposed on top of the leads 111 comprises a plurality of bumps 121 and a plurality of solders 122 formed at the bumps 121, each solder 122 comprises a first height H1, each bump 121 comprises a second height H2, and the second height H2 is not smaller than the first height H1. The coupling protrusions 115 of the leads 111 embed into the solders 122 to make the ring surfaces 115a of the coupling protrusions 115 cladded with the solders 122, and the solders 122 cover the first upper surfaces 112a of the first end portions 112 so as to increase the coupling strength and electrical reliability between the chip 120 and the lead frame 110.

With reference to FIG. 1 again, in this embodiment, the coupling protrusions 115 further comprises a plurality of coupling surfaces 115b, the bumps 121 comprises a plurality of top surfaces 121a, each coupling surface 115b comprises a first width W1, each top surface 121a comprises a second width W2, and the first width W1 is not bigger than the second width W2. The coupling surfaces 115b contact against the top surfaces 121a. The chip 120 and the leads 111 are cladded by the molding compound 130. The molding compound 130 exposes the first lower surface 112b of each of the first end portions 112 and the third surface 114b of each of the second end portions 114. Further, in this embodiment, the lead frame 110 further comprises a connection layer 116 formed at the first upper surface 112a, the first lower surfaces 112b, the second upper surfaces 113a, the second lower surfaces 113b, the third upper surfaces 114a and the third lower surfaces 114b to prevent the leads 111 of the lead frame 110 from excessive oxidation. The material of the connection layer 116 is composed of nickel, palladium and gold. The primary object of the present invention is described as below, in the process of heat laminating the chip 120 and the lead frame 110, the coupling protrusions 115 integrally formed as one piece with the leads 111 directly penetrate the solders 122 and connect the bumps 121 of the chip 120 to make the lead frame 110 electrically connected with the chip 120, which omits the usage and clearance procedure of a flux therefore lowering process complexity. In addition, the coupling protrusions 115 possess said coupling surfaces 115b and fixed height so that the joining height of the solders 122 can be maintained in the heat lamination process. By means of the coupling surfaces 115b contacting against the top surfaces 121a of the bumps 121 and said fixed joining height, the coupling strength and electrical reliability between the lead frame 110 and the chip 120 can be effectively raised.

While this invention has been particularly illustrated and described in detail with respect to the preferred embodiments thereof, it will be clearly understood by those skilled in the art that it is not limited to the specific features and describes and various modifications and changes in form and details may be made without departing from the spirit and scope of this invention.

What is claimed is:

1. A semiconductor package at least including:
   a lead frame having a plurality of leads, each lead comprises a first end portion, a half-etched portion in connection with the first end portion and at least one coupling protrusion,
   wherein the first end portion comprises a first upper surface and a first lower surface, the half-etched portion comprises a second upper surface and a second lower surface, the coupling protrusion is integrally formed as one piece with the first upper surface and comprises a ring surface;
   at least one chip disposed on top of the leads, said chip comprises a plurality of bumps and a plurality of solders formed at the bumps, the coupling protrusions embed into the solders to make the ring surfaces of the coupling protrusions cladded with the solders, and the solders partially cover the first upper surfaces; and
   a molding compound for exposing the first lower surface of each of the first end portions, wherein the chip and the leads are partially cladded with said molding compound.

2. The semiconductor package in accordance with claim 1, wherein the coupling protrusions further comprise a plurality of coupling surfaces, the bumps comprise a plurality of top surfaces, each coupling surface comprises a first width, each top surface comprises a second width, and the first width is not larger than the second width.

3. The semiconductor package in accordance with claim 2, wherein the coupling surfaces contact against the top surfaces.

4. The semiconductor package in accordance with claim 1, wherein each lead further comprises a second end portion in connection with the half-etched portion, the half-etched portion is located between the first end portion and a second end portion, the second end portion comprises a third upper surface and a third lower surface, and the molding compound exposes each third lower surface.

5. The semiconductor package in accordance with claim 1, wherein each lead further comprises a connection layer formed at the first upper surfaces, the first lower surfaces, the second upper surfaces and the second lower surfaces.

6. The semiconductor package in accordance with claim 1, wherein each solder comprises a first height, each bump comprises a second height, and the second height is not smaller than the first height.

7. The semiconductor package in accordance with claim 1, wherein each ring surface is an inclined surface.

* * * * *